US 8,182,882 B2

(12) United States Patent
Johnson et al.

(10) Patent No.: US 8,182,882 B2
(45) Date of Patent: May 22, 2012

(54) METHOD OF MAKING A 3-D OBJECT FROM PHOTOCURABLE COMPOSITIONS CONTAINING REACTIVE POLYSILOXANE PARTICLES

(75) Inventors: David Johnson, Los Angeles, CA (US); John Wai Fong, Los Angeles, CA (US)

(73) Assignee: 3D Systems, Inc., Rock Hill, SC (US)

( * ) Notice: Subject to any disclaimer, the term of this patent is extended or adjusted under 35 U.S.C. 154(b) by 776 days.

(21) Appl. No.: 11/931,131

(22) Filed: Oct. 31, 2007

(65) Prior Publication Data

US 2008/0057217 A1   Mar. 6, 2008

Related U.S. Application Data

(60) Division of application No. 10/511,924, filed on Oct. 18, 2004, now Pat. No. 7,307,123, which is a continuation-in-part of application No. 10/125,508, filed on Apr. 19, 2002, now abandoned.

(51) Int. Cl.
C08F 2/46   (2006.01)

(52) U.S. Cl. .......................... 427/508; 427/487; 427/517

(58) Field of Classification Search .................. 427/487, 427/508, 517, 407.1
See application file for complete search history.

(56) References Cited

U.S. PATENT DOCUMENTS

| | | | |
|---|---|---|---|
| 3,856,883 A | 12/1974 | Dickie et al. | |
| 4,026,970 A | 5/1977 | Backderf et al. | |
| 4,082,895 A | 4/1978 | Backderf et al. | |
| 4,645,803 A | 2/1987 | Kohli et al. | |
| 4,668,736 A | 5/1987 | Robins et al. | |
| 4,778,851 A | 10/1988 | Henton et al. | |
| 4,846,905 A | 7/1989 | Tarbutton et al. | |
| 4,853,434 A | 8/1989 | Block | |
| 4,983,672 A | 1/1991 | Almer et al. | |
| 5,002,854 A | 3/1991 | Fan et al. | |
| 5,177,122 A | 1/1993 | Shih | |
| 5,280,067 A | 1/1994 | Tarbutton et al. | |
| 5,332,781 A | 7/1994 | Eldin et al. | |
| 5,426,150 A | 6/1995 | Eldin et al. | |
| 5,461,088 A | 10/1995 | Wolf et al. | |
| 5,463,084 A | 10/1995 | Crivello et al. | |
| 5,476,748 A | 12/1995 | Steinmann et al. | |
| 5,639,413 A | 6/1997 | Crivello | |
| 5,707,773 A | 1/1998 | Grossman et al. | |
| 5,707,780 A | 1/1998 | Lawton et al. | |
| 5,789,482 A | 8/1998 | Eldin et al. | |
| 5,972,563 A | 10/1999 | Steinmann et al. | |
| 6,096,796 A | 8/2000 | Watanabe et al. | |
| 6,111,015 A | 8/2000 | Eldin et al. | |
| 6,210,854 B1 | 4/2001 | Grossman et al. | |
| 6,287,745 B1 | 9/2001 | Yamamura et al. | |
| 6,365,644 B1 | 4/2002 | Yamamura et al. | |
| 6,413,286 B1 * | 7/2002 | Swei et al. ....................... | 51/298 |
| 6,685,869 B2 | 2/2004 | Yamamura et al. | |
| 2001/0046642 A1 | 11/2001 | Johnson et al. | |
| 2002/0132872 A1 | 9/2002 | Yamamura et al. | |

FOREIGN PATENT DOCUMENTS

| | | |
|---|---|---|
| CA | 2039404 | 10/1991 |
| DE | 2023473 | 11/1970 |
| EP | 0169066 | 1/1986 |
| EP | 0245018 | 11/1987 |
| EP | 0336732 | 10/1989 |
| EP | 0360869 | 4/1990 |
| EP | 0393675 | 10/1990 |
| EP | 0403758 | 12/1990 |
| EP | 449776 | 10/1991 |
| EP | 0565206 | 10/1993 |
| EP | 576397 | 12/1993 |
| EP | 0640876 | 3/1995 |
| EP | 0938026 | 8/1999 |
| GB | 1247116 | 9/1971 |
| JP | 2-75618 | 3/1990 |
| WO | WO 00/63272 | 10/2000 |
| WO | WO 01/95030 | 12/2001 |

OTHER PUBLICATIONS

Yorkgitis, E.M., et al., "Siloxane-Modified Epoxy Resins," *Advances in Polymer Science*, pp. 80-109, (1985) 72.
Pottick, "Kraton® Rubber Modified Epoxy Blends," *34th International SAMPE Symposium*, May 8-11, 1989, p. 2243-2254.
Pottick, "Toughening of Epoxy Resins with Styrenic Block Copolymers," *Polym. Nater. Sci. Eng.*, vol. 63, pp. 26-31, 1990.

* cited by examiner

*Primary Examiner* — Elena T Lightfoot

(57) ABSTRACT

A method of making a 3-D object from a photocurable composition, including (a) a cationically curable monomer; (b) a radically curable monomer; (c) reactive particles comprising a crosslinked polysiloxane core and a shell of reactive groups on an outer surface of the core, wherein the reactive groups comprise epoxy groups, ethylenically unsaturated groups, or hydroxy groups; (d) a radical photoinitiator; and (e) a cationic photoinitiator; the method comprising (1) forming a first layer of the photocurable composition; (2) exposing the first layer to actinic radiation sufficient to harden the first layer; (3) forming a second layer of the photocurable composition above the hardened first layer; (4) exposing the second layer to actinic radiation sufficient to harden the second layer; and (5) repeating steps (3)-(4) as needed to form a 3-D object.

4 Claims, No Drawings

METHOD OF MAKING A 3-D OBJECT FROM PHOTOCURABLE COMPOSITIONS CONTAINING REACTIVE POLYSILOXANE PARTICLES

CROSS REFERENCE TO RELATED APPLICATIONS

This application is a divisional application of U.S. patent application Ser. No. 10/511,924, filed Oct. 18, 2004, now U.S. Pat. No. 7,307,123, issued Dec. 11, 2007, which is a continuation-in-part of U.S. patent application Ser. No. 10/125,508, filed Apr. 19, 2002, abandoned. The noted applications are incorporated herein by reference.

BACKGROUND OF THE INVENTION

1. Field of the Invention

The invention relates to photocurable compositions, more particularly to photocurable compositions for stereolithography.

2. Related Art

U.S. Pat. No. 5,002,854 to Fan et al. discloses a photohardenable composition for stereolithography containing filler particles that are core shell polymers. The core is a crosslinked multifunctional ethylenically unsaturated monomer; the shell is based on a monofunctional ethylenically unsaturated monomer. The particles are non-reactive and do not chemically bond to the polymer matrix formed on curing the composition.

U.S. Pat. No. 5,461,088 to Wolf et al. discloses a stereolithography formulation containing a polysiloxane block copolymer that is added to the formulation as an oil or crystals. The block copolymer is not a core-shell polymer and contains no reactive epoxy groups or ethylenically unsaturated groups. U.S. Pat. No. 5,463,084 to Crivello et al. discloses a photocurable composition containing silicone oxetane monomers that are liquid. U.S. Pat. No. 5,639,413 to Crivello discloses a photocurable composition containing a cyclohexylepoxy siloxane monomer that is liquid.

3-D objects made by stereolithography are generally clear or slightly hazy, and tend to have rough surfaces. Opaque white objects with smooth surfaces are desirable as similar to plastic objects made by non-stereolithography processes. Smooth sidewalls are especially useful when using an object prepared from stereolithography as a model to prepare a mold. There is therefore a need for alternative photocurable compositions for stereolithography to allow for variation in color, opacity, and surface properties. In particular, there is a need for stereolithography compositions that form opaque white objects with improved surface properties.

SUMMARY OF THE INVENTION

The invention provides a photocurable composition, including (a) a cationically curable monomer; (b) a radically curable monomer; (c) reactive particles comprising a crosslinked polysiloxane core and a shell of reactive groups on an outer surface of the core, wherein the reactive groups comprise epoxy groups, ethylenically unsaturated groups, or hydroxy groups; (d) a radical photoinitiator; and (e) a cationic photoinitiator.

The invention also provides a method of making a 3-D object from such a composition by forming a first layer of the photocurable composition; exposing the first layer to actinic radiation sufficient to harden the first layer; forming a second layer of the photocurable composition above the hardened first layer; exposing the second layer to actinic radiation sufficient to harden the second layer; and repeating the previous two steps as needed to form a 3-D object.

DETAILED DESCRIPTION OF THE INVENTION

"Stereolithography" is a process that produces solid objects from computer-aided design ("CAD") data. CAD data of an object is first generated and then is sliced into thin cross sections. A computer controls a laser beam that traces the pattern of a slice through a liquid plastic, solidifying a thin layer of the plastic corresponding to the slice. The solidified layer is recoated with liquid plastic and the laser beam traces another slice to harden another layer of plastic on top of the previous one. The process continues layer by layer to complete the part. A desired part may be built in a matter of hours. This process is described in U.S. Pat. No. 5,476,748 to Steinmann et al., U.S. Patent Publication No. 2001/0046642 to Johnson et al., and by Jacobs in "Rapid Prototyping & Manufacturing" (Society of Manufacturing Engineers, 1992), the entire contents of which documents are incorporated herein by reference.

"3-D object" means a three-dimensional object made from at least two layers of a cured resin composition.

"Polymerization" is a chemical reaction linking monomers to form larger molecules. The resulting polymers have units that correspond to the monomers.

A "monomer" is a compound that is capable of polymerizing with other monomers to form a polymer chain or matrix. The term "monomer" refers to compounds with one or more reactive groups and includes oligomers that are, e.g., dimers or trimers formed from two or three monomer units, respectively.

"Crosslinked" means a polymer that contains bonds between atoms of two or more different polymer chains. The result is a matrix that develops rigidity because the polymer chains are bonded together and can not flow freely. Crosslinked polymers generally result from polymerizing monomers that have more than one reactive site, i.e., the monomers are polyfunctional.

"Curing" means to polymerize a mixture including one or more monomers and one or more initiators. "Hardening" may be synonymous with curing and emphasizes that when polymerized, liquid monomer mixtures tend to become solid.

"Photocurable composition" means a composition that may be cured or hardened by a polymerization reaction that is initiated by actinic radiation.

"Actinic radiation" is light energy at a wavelength that allows a given chemical compound to absorb the light energy and form a reactive species. For stereolithography, typically a laser beam or a flood lamp generates the actinic radiation.

"Cationically curable" means a monomer that can polymerize by cationic polymerization, a mechanism that involves cations, i.e., chemical species that are positively charged.

"Radically curable" means a monomer that can polymerize by radical polymerization, a mechanism that involves radicals, i.e., chemical species with an unpaired valence electron.

"Photoinitiator" is a compound that absorbs actinic radiation to form a reactive species that initiates a chemical reaction such as polymerization.

A "cationic photoinitiator" is a photoinitiator that generates cations when exposed to actinic radiation and thereby initiates cationic polymerization.

A "radical photoinitiator" is a photoinitiator that generates radicals when exposed to actinic radiation and thereby initiates radical polymerization.

"(Meth)acrylate" refers to an acrylate, methacrylate, or a combination thereof.

"Hybrid composition" means a photocurable composition with at least one radically curable component and at least one canonically curable component.

A. CATIONICALLY CURABLE MONOMER

Examples of cationically curable monomers are disclosed in, e.g., U.S. Pat. No. 5,476,748 and U.S. Patent Publication No. 2001/0046642 A1, both incorporated herein by reference.

The photocurable composition preferably contains from 15 to 80% by weight of cationically curable monomer, more preferably from 50 to 75% by weight.

The cationically curable monomer may include one or more epoxide compounds in which the epoxide groups form part of an alicyclic or heterocyclic ring system. The alicyclic epoxide preferably includes at least one alicyclic polyepoxide having at least two epoxy groups per molecule. Preferably, the alicyclic polyepoxide is in a relatively pure form in terms of oligomer (e.g., dimer, trimer, etc.) content. Preferably, the alicyclic polyepoxide has a monomer purity of over about 90%, more preferably over about 94%, even more preferably 98% or higher. Ideally, dimers or trimers or higher oligomers are substantially eliminated. Preferably, the alicyclic polyepoxide has an epoxy equivalent weight from 80 and 330, more preferably from 90 and 300, even more preferably from 100 and 280.

Examples of alicyclic polyepoxides include bis(2,3-epoxycyclopentyl)ether, 2,3-epoxycyclopentyl glycidyl ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexylmethyl 3,4-epoxycyclohexanecarboxylate, 3,4-epoxy-6-methylcyclohexylmethyl 3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate, ethanediol di(3,4-epoxycyclohexylmethyl)ether, vinylcyclohexene dioxide, dicyclopentadiene diepoxide or 2-(3,4-epoxycyclohexyl-5,5-spiro-3,4-epoxy)cyclohexane-1,3-dioxane.

3,4-epoxycyclohexylmethyl 3',4'-epoxycyclohexanecarboxylate having an epoxy equivalent weight from 130 and 145 with varying degrees of monomer purity are commercially available. Araldite CY179 of Ciba Speciality Chemicals has monomer purity of about 90%. UVR6105 of DOW Corp. contains a smaller percentage of oligomers and thus has higher monomer purity than Araldite CY 179. Preferred is Uvacure 1500 of UCB Radcure Corp., which has monomer purity of about 98.5%.

The photocurable composition preferably contains from 5 to 80% by weight, more preferably from 10 and 75% by weight, even more preferably from 15 to 70% by weight of alicyclic polyepoxide.

The component (a) may include a monomer with at least one epoxycyclohexyl group that is bonded directly or indirectly to a group containing at least one silicon atom. These monomers may be linear, branched, or cyclic in structure. Examples are disclosed in U.S. Pat. No. 5,639,413, which is incorporated herein by reference.

The photocurable composition preferably includes one or more cationically curable compounds that are polyglycidyl ethers, poly(β-methylglycidyl)ethers, polyglycidyl esters, poly(β-methylglycidyl)esters, poly(N-glycidyl) compounds, and poly(S-glycidyl) compounds. Cationically curable oxetanes are disclosed in U.S. Pat. No. 5,463,084, incorporated herein by reference.

Polyglycidyl ethers can be obtained by reacting a compound having at least two free alcoholic hydroxyl groups and/or phenolic hydroxyl groups with a suitably substituted epichlorohydrin under alkaline conditions or in the presence of an acidic catalyst followed by alkali treatment. Ethers of this type may be derived, for example, from acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene)glycols, pentane-1,5-diol, hexane-1,6-diol, hexane-2,4,6-triol, glycerol, 1,1,1-trimethylolpropane, bistrimethylolpropane, pentaerythritol, sorbitol, and from polyepichlorohydrins. Suitable glycidyl ethers can also be obtained from cycloaliphatic alcohols such as 1,3- or 1,4-dihydroxycyclohexane, bis(4-hydroxycyclohexyl)methane, 2,2-bis(4-hydroxycyclohexyl)propane or 1,1-bis(hydroxymethyl)cyclohex-3-ene, or aromatic alcohols such as N,N-bis(2-hydroxyethyl)aniline or p,p'-bis(2-hydroxyethylamino)diphenylmethane.

Examples of preferred polyglycidyl ethers include trimethylolpropane triglycidyl ether, triglycidyl ether of polypropoxylated glycerol, and diglycidyl ether of 1,4-cyclohexanedimethanol.

The following are examples of commercially available cationically curable monomers: Uvacure 1500, Uvacure 1501, Uvacure 1502 (1501 and 1502 have been discontinued by UCB), Uvacure 1530, Uvacure 1531, Uvacure 1532, Uvacure 1533, Uvacure 1534, Uvacure 1561, Uvacure 1562, all commercial products of UCB Radcure Corp., Smyrna, Ga.; UVR-6100, UVR-6105, UVR-6110, UVR-6128, UVR-6200, UVR-6216 of DOW Corp.; the Araldite GY series that is Bisphenol A epoxy liquid resins, the Araldite CT and GT series that is Bisphenol A epoxy solid resins, the Araldite GY and PY series that is Bisphenol F epoxy liquids, the cycloaliphatic epoxides Araldite CY 179 and PY 284, the Araldite DY and RD reactive diluents series, the Araldite ECN series of epoxy cresol novolacs, the Araldite EPN series of epoxy phenol novolacs, all commercial products of Ciba Specialty Chemicals Corp., the Heloxy 44, Heloxy 48, Heloxy 84, Heloxy 107, and others in the Heloxy product line, the EPON product line, all of Resolution Performance Products (Houston, Tex.), the DER series of flexible aliphatic and Bisphenol A liquid or solid epoxy resins, the DEN series of epoxy novolac resins, all commercial products of Dow Corp.; Celoxide 2021, Celoxide 2021P, Celoxide 2081, Celoxide 2083, Celoxide 2085, Celoxide 2000, Celoxide 3000, Glycidole, AOEX-24, Cyclomer A200, Cyclomer M-100, Epolead GT-300, Epolead GT-302, Epolead UT-400, Epolead 401, Epolead 403, (Daicel Chemical Industries Co., Ltd.), Epicoat 828, Epicoat 812, Epicoat 872, Epicoat CT 508 (Yuka Shell Co., Ltd.), KRM-2100, KRM-2110, KRM-2199, KRM-2400, KRM-2410, KRM-2408, KRM-2490, KRM-2200, KRM-2720, KRM-2750 (Asahi Denka Kogyo Co., Ltd.).

The cationically curable monomer may include compounds containing vinyl ether groups. Preferred examples are aliphatic polyalkoxy di(poly)vinylethers, polyalkylene di(poly)vinylethers, and hydroxy-functionalized mono(poly)vinylethers. More preferred vinylethers are those having aromatic or alicyclic moieties in their molecules. Preferably, the vinylether component is from 0.5 to 20% by weight of the photocurable composition. More preferably the vinylether component is from 2 to 17% by weight. Even more preferably, the vinyl ether component is from 3 to 14% by weight.

Examples of vinyl ethers include ethyl vinylether, n-propyl vinylether, isopropyl vinylether, n-butyl vinylether, isobutyl vinylether, octadecyl vinylether, cyclohexyl vinylether, butanediol divinylether, cyclohexanedimethanol divinylether, diethyleneglycol divinylether, triethyleneglycol divinylether, tert-butyl vinylether, tert-amyl vinylether, ethylhexyl vinylether, dodecyl vinylether, ethyleneglycol divinylether, ethyleneglycolbutyl vinylether, hexanediol divinylether, triethyleneglycol methylvinylether, tetraethyleneglycol divinylether, trimethylolpropane trivinylether, aminopropyl vinylether, diethylaminoethyl vinylether, ethylene glycol divinyl ether, polyalkylene glycol divinyl ether, alkyl vinyl ether and 3,4-dihydropyran-2-methyl 3,4-dihydropyran-2-carboxylate. Examples of commercial vinyl ethers include the Pluriol-E200 divinyl ether (PEG200-DVE), poly-THF290 divinylether (PTHF290-DVE) and polyethyleneglycol-520 methyl vinylether (MPEG500-VE) all of BASF Corp.

Examples of hydroxy-functionalized mono(poly)vinylethers include polyalkyleneglycol monovinylethers, polyalkylene alcohol-terminated polyvinylethers, butanediol monovinylether, cyclohexanedimethanol monovinylether, ethyleneglycol monovinylether, hexanediol monovinylether, and diethyleneglycol monovinylether.

Further examples of vinyl ethers are disclosed in U.S. Pat. No. 5,506,087, incorporated herein by reference.

Examples of commercial vinyl ethers include Vectomer 4010 (HBVE isophthalate), Vectomer 4020 (pentanedioic acid, bis[[4-[(ethenyloxy)methyl]cyclohexyl]methyl]ester), Vectomer 4051 (CHMVE terephthalate), Vectomer 4060 (vinyl ether terminated aliphatic ester monomer: HBVE adipate), and Vectomer 5015 (tris(4-vinyloxybutyl)trimellitate), all of Morflex, Inc., Greensboro, N.C. Preferred vinyl ethers are Vectomer 4010 and Vectomer 5015.

The photocurable composition of the invention may include mixtures of the cationically curable compounds described above.

B. RADICALLY CURABLE MONOMER

The radically curable monomer (b) of the invention is preferably ethylenically unsaturated. More preferably, the monomer is a (meth)acrylate. The monomer may include at least one poly(meth)acrylate, e.g., a di-, tri-, tetra- or pentafunctional monomeric or oligomeric aliphatic, cycloaliphatic, or aromatic (meth)acrylate. The poly(meth) acrylate preferably has a molecular weight of from 200 to 500.

Examples of di(meth)acrylates include di(meth)acrylates of cycloaliphatic or aromatic diols such as 1,4-dihydroxymethylcyclohexane, 2,2-bis(4-hydroxy-cyclohexyl)propane, bis(4-hydroxycyclohexyl)methane, hydroquinone, 4,4'-dihydroxybiphenyl, Bisphenol A, Bisphenol F, bisphenol S, ethoxylated or propoxylated Bisphenol A, ethoxylated or propoxylated Bisphenol F, and ethoxylated or propoxylated bisphenol S. Di(meth)acrylates of this kind are known and some are commercially available, e.g., Ebecryl 3700 (UCB Chemicals).

Alternatively, the di(meth)acrylate may be acyclic aliphatic, rather than cycloaliphatic or aromatic.

Preferably, the poly(meth)acrylate includes a tri(meth) acrylate or higher. Preferred compositions are those in which the free radically curable component contains a tri(meth) acrylate or a penta(meth)acrylate. Examples are the tri(meth) acrylates of hexane-2,4,6-triol, glycerol, 1,1,1-trimethylolpropane, ethoxylated or propoxylated glycerol, and ethoxylated or propoxylated 1,1,1-trimethylolpropane. Other examples are the hydroxyl-containing tri(meth)acrylates obtained by reacting triepoxide compounds (e.g., the triglycidyl ethers of the triols listed above) with (meth)acrylic acid. Other examples are pentaerythritol tetraacrylate, bistrimethylolpropane tetraacrylate, pentaerythritol monohydroxytri (meth)acrylate, or dipentaerythritol monohydroxypenta(meth)acrylate.

The poly(meth)acrylate may include polyfunctional urethane(meth)acrylates. Urethane (meth)acrylates can be prepared by, e.g., reacting a hydroxyl-terminated polyurethane with acrylic acid or methacrylic acid, or by reacting an isocyanate-terminated prepolymer with hydroxyalkyl(meth) acrylates to give the urethane(meth)acrylate.

Examples of suitable aromatic tri(meth)acrylates are the reaction products of triglycidyl ethers of trihydric phenols and phenol or cresol novolaks containing three hydroxyl groups, with (meth)acrylic acid.

The following are examples of commercial poly(meth) acrylates: SR® 295, SR® 350, SR® 351, SR® 367, SR® 368, SR® 399, SR® 444, SR® 454, and SR® 9041 (SARTOMER Company).

SR® 368 is an example of an isocyanurate triacrylate, which is preferably included in the photocurable composition with a smaller amount of a monohydroxypentaacrylate such as SR® 399 to avoid producing tacky sidewalls in the 3-D object.

Additional examples of commercially available acrylates include KAYARAD R-526, HDDA, NPGDA, TPGDA, MANDA, R-551, R-712, R-604, R-684, PET-30, GPO-303, TMPTA, THE-330, DPHA-2H, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040, R-011, R-300, R-205 (Nippon Kayaku Co., Ltd.), Aronix M-210, M-220, M-233, M-240, M-215, M-305, M-309, M-310, M-315, M-325, M-400, M-6200, M-6400 (Toagosei Chemical Industry Co, Ltd.), Light acrylate BP-4EA, BP-4PA, BP-2EA, BP-2PA, DCP-A (Kyoeisha Chemical Industry Co., Ltd.), New Frontier BPE-4, TEICA, BR-42M, GX-8345 (Daichi Kogyo Seiyaku Co., Ltd.), ASF-400 (Nippon Steel Chemical Co.), Ripoxy SP-1506, SP-1507, SP-1509, VR-77, SP-4010, SP-4060 (Showa Highpolymer Co., Ltd.), NK Ester A-BPE-4 (Shin-Nakamura Chemical Industry Co., Ltd.), SA-1002 (Mitsubishi Chemical Co., Ltd.), Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (Osaka Organic Chemical Industry Co., Ltd.).

Preferably, the radically curable monomer includes a compound having at least one terminal and/or at least one pendant (i.e., internal) unsaturated group and at least one terminal and/or at least one pendant hydroxyl group. The composition may contain more than one such compound. Examples of such compounds include hydroxy mono(meth)acrylates, hydroxy poly(meth)acrylates, hydroxy monovinylethers, and hydroxy polyvinylethers. Commercially available examples include dipentyaerythritol pentaacrylate (SR® 399), pentaerythritol triacrylate (SR® 444), and bisphenol A diglycidyl ether diacrylate (Ebecryl 3700).

The photocurable composition preferably contains up to 60%, more preferably from 5 to 20%, even more preferably from 9 to 15% of radically curable monomer(s).

In one embodiment, the photocurable composition contains up to 40% by weight, more preferably from 5 to 20% by weight, of a cycloaliphatic or aromatic di(meth)acrylate and up to 15% by weight, preferably up to 10% by weight of a poly(meth)acrylate with 3 or more (meth)acrylate groups.

The ratio of diacrylate to poly(meth)acrylate with 3 or more (meth)acrylate groups may vary, but preferably the latter is no more than 50% of total (meth)acrylates.

In another embodiment, the photocurable composition may contain much smaller relative amounts of di(meth)acrylate, and may even contain exclusively poly(meth)acrylates with 3 or more (meth)acrylate groups as radically curable monomer (b) with no or substantially no di(meth)acrylate.

The photocurable composition of the invention may include mixtures of the radically curable compounds described above.

C. REACTIVE PARTICLES

The reactive particles have a core containing a crosslinked polysiloxane and a shell containing reactive groups.

The reactive particles may be made by the method disclosed in U.S. Pat. No. 4,853,434 to Block, incorporated in its entirety herein by reference. Block discloses reactive particles that are useful in producing fiber-reinforced plastics, structural adhesives, laminated plastics, and annealing lacquers.

The core is a crosslinked polyorganosiloxane rubber that may include dialkylsiloxane repeating units, where "alkyl" is C1-C6 alkyl. The core preferably includes dimethylsiloxane repeating units.

The reactive groups preferably include epoxy groups, ethylenically unsaturated groups, and/or hydroxy groups. For example, the reactive groups may include oxirane, glycidyl, vinyl ester, vinyl ether, or acrylate groups, or combinations thereof.

The reactive particles react with the polymer matrix that forms when the photocurable composition is polymerized by forming one or more chemical bonds to the polymer matrix via the reactive groups. Preferably, the reactive groups react substantially completely on curing the photocurable composition.

The amount of reactive particles in the photocurable composition may be varied as needed depending on the particular components (a) and (b) in a given photocurable composition. At high concentrations of reactive particles the photocurable composition may become too viscous and bubble formation may be a problem. Preferably the photocurable composition contains from 1 to 50% by weight of the reactive particles, more preferably from 5 to 15% by weight.

The reactive particles preferably have an average particle diameter of 0.01 to 50 μm, more preferably 0.1 to 5 μm.

Preferred reactive particles that are available commercially are Albidur EP 2240, Albidur VE 3320, and Albidur EP 5340 (Hanse Chemie, Germany). Preferably, the reactive particles are added to the photocurable composition as a mixture of the reactive particles and a reactive liquid medium containing, e.g., epoxy or ethylenically unsaturated groups. For example, in Albidur EP 2240, the reactive organosiloxane particles are dispersed in bisphenol A glycidyl ether, in bisphenol A vinyl ester for Albidur VE 3320, and in cycloaliphatic epoxide for Albidur EP 5340.

Commercial dispersions of reactive particles may be heated at from 50 to 60° C. to reduce viscosity, preferably without stirring. Stirring while heating may cause instability in the reactive particles. The commercially available reactive particle dispersions are preferably used within the manufacturer's listed shelf life; otherwise the solids may coagulate and settle out of solution over time.

Compatibility of the reactive particles and the commercially available dispersions thereof with components (a) and (b) will vary depending on their relative polarities. This must be taken into account in preparing formulations that are suitable for stereolithography.

D. PHOTOINITIATORS

Radical photoinitiator (d) may be chosen from those commonly used to initiate radical photopolymerization. Examples of radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzil ketals, e.g., benzil dimethylketal and benzil diethyl ketal; anthraquinones, e.g., 2-methylanthraquinone, 2-ethylanthraquinone, 2-tert-butylanthraquinone, 1-chloroanthraquinone and 2-amylanthraquinone; triphenylphosphine; benzoylphosphine oxides, e.g., 2,4,6-trimethylbenzoyl-diphenylphosphine oxide (Luzirin® TPO); bisacylphosphine oxides; benzophenones, e.g., benzophenone and 4,4'-bis(N,N'-di-methyl-amino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure 2959; Ciba Specialty Chemicals); 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone.

Preferably, the photocurable composition includes a 1-hydroxy phenyl ketone, more preferably 1-hydroxycyclohexyl phenyl ketone, e.g., Irgacure 184 (Ciba Specialty Chemicals).

The radical photoinitator is preferably present at from 0.1 to 10% by weight, more preferably from 0.3 to 8% by weight, most preferably from 0.4 to 7% by weight of the photocurable composition.

Cationic photoinitiators (e) may be chosen from those commonly used to initiate cationic photopolymerization. Examples include onium salts with anions of weak nucleophilicity, e.g., halonium salts, iodosyl salts, sulfonium salts, sulfoxonium salts, or diazonium salts. Metallocene salts are also suitable as photoinitiators. Onium salt and metallocene salt photoinitiators are described in U.S. Pat. No. 3,708,296; "UV-Curing, Science and Technology", (Editor: S. P. Pappas, Technology Marketing Corp., Stamford, Conn.); and "Chemistry & Technology of UV & EB Formulations for Coatings, Inks & Paints," Vol. 3 (edited by P. K. T. Oldring), each of which is incorporated herein by reference.

Examples of commercial cationic photoinitiators include UVI-6974, UVI-6976, UVI-6970, UVI-6960, UVI-6990 (manufactured by DOW Corp.), CD-1010, CD-1011, CD-1012 (manufactured by Sartomer Corp.), Adekaoptomer SP-150, SP-151, SP-170, SP-171 (manufactured by Asahi Denka Kogyo Co., Ltd.), Irgacure 261 (Ciba Specialty Chemicals Corp.), CI-2481, CI-2624, CI-2639, CI-2064 (Nippon Soda Co, Ltd.), DTS-102, DTS-103, NAT-103, NDS-103, TPS-103, MDS-103, MPI-103, BBI-103 (Midori Chemical Co, Ltd.). Most preferred are UVI-6974, CD-1010, UVI-6976, Adekaoptomer-SP-170, SP-171, CD-1012, and MPI-103. The cationic photoinitiators can be used either individually or in combination of two or more. The cationic photoinitator is preferably present at from 0.05 to 12% by weight, more preferably from 0.1 to 11% by weight, most preferably from 0.15 to 10% by weight of the photocurable composition.

For stereolithography using a laser, the radical and cationic photoinitiators are preferably selected and their concentrations are preferably adjusted to achieve an absorption capacity such that the depth of cure at the normal laser rate is from about 0.1 to about 2.5 mm.

E. OTHER COMPONENTS

The photocurable composition may contain a variety of other components. Examples of such components include modifiers, tougheners, stabilizers, antifoaming agents, leveling agents, thickening agents, flame retardants, antioxidants, pigments, dyes, fillers, and combinations thereof.

The photocurable composition may contain one or more polytetramethylene ether glycols ("poly THF"). The poly THF preferably has molecular weight from about 250 to 2500. The poly THF may be terminated with hydroxy, epoxy, or ethylenically unsaturated group(s). Polytetramethylene ether glycols are commercially available in the Polymeg® line (Penn Specialty Chemicals). Preferably, the photocurable composition includes Polymeg® 1000 or Polymeg® 2000.

The photocurable composition may also contain one or more diols such as 1,4-cyclohexanedimethanol ("CHDM").

The photocurable composition may also contain one or more stabilizers. Preferred stabilizers are hindered amines, e.g., benzyl dimethyl amine ("BDMA").

F. STEREOLITHOGRAPHY EQUIPMENT

The actinic radiation is generally a beam of light that is controlled by a computer. Preferably, the beam is a laser beam controlled by a mirror.

In principle any stereolithography machine may be used to carry out the inventive method. Stereolithography equipment is commercially available from various manufacturers. Table I lists commercial SL equipment available from 3D Systems, Inc. (Valencia, Calif.).

TABLE I

| Stereolithography Machines | |
|---|---|
| Machine | Wavelength (nm) |
| SLA 250 | 325 |
| SLA 2500 (Viper) | 355 |
| SLA 3500 | 355 |
| SLA 500 | 351 |
| SLA 5000 | 355 |
| SLA 7000 | 355 |

"Green model" is the 3-D object initially formed by the stereolithography process of layering and curing, where typically the layers are not completely cured. This permits successive layers to better adhere by bonding together when further cured.

"Postcuring" is the process of reacting a green model to further cure the partially cured layers. A green model may be postcured by exposure to heat, actinic radiation, or both.

"Green strength" is a general term for mechanical performance properties of a green model, including modulus, strain, strength, hardness, and layer-to-layer adhesion. For example, green strength may be reported by measuring flexural modulus (ASTM D 790). An object having low green strength may deform under its own weight, or may sag or collapse during curing.

"Penetration depth" ("$D_p$") is a property of a given pairing of photocurable composition and laser. $D_p$ is the slope of a plot ("working curve") of cure depth (mm) against the log of exposure (mJ/cm$^2$). "Cure depth" is the measured thickness of a layer formed by exposing the photocurable composition to a specified dose of energy from the laser.

"Critical Exposure" ("$E_c$") is a property of a photocurable composition and expresses the threshold amount of radiation in mJ/cm$^2$ that causes the photocurable composition to gel. The $E_c$ is the maximum exposure value of the working curve when cure depth is still zero.

"Dispersed" means a separate phase, e.g., of particles distributed by mixing in a photocurable composition.

G. EXAMPLES

The general procedure used for preparing 3-D objects with SL equipment is as follows. The photocurable composition was placed in a 300-700 ml plastic container or in a vat designed for use with the stereolithography machines. The specific container depends on the size of the desired 3-D object. The photocurable composition was poured into the container within the machine at about 30° C. The surface of the composition, in its entirety or a predetermined pattern, was irradiated with a UV/VIS light source so that a layer of a desired thickness cured and solidified in the irradiated area. A new layer of the photocurable composition was formed on the solidified layer. The new layer was likewise irradiated over the entire surface or in a predetermined pattern. The newly solidified layer adhered to the underlying solidified layer. Repeating the layer formation step and the irradiation step produced a green model of multiple solidified layers.

The green model was then rinsed in tripropylene glycol monomethyl ether ("TPM"). The green model was then rinsed with water and dried with compressed air. The dried green model was then postcured with UV radiation in a post-cure apparatus ("PCA") for about 60-90 minutes.

Stereolithography equipment typically allows for setting various operational parameters. Examples thereof appear in Tables II and III below. The parameters are well known to a person of skill in the art of stereolithography and may be adjusted as needed depending on various factors, including the specific photocurable composition and the geometry of the desired 3-D object.

"Layer Thickness" is the thickness of each slice or layer of the 3-dimensional object that is to be built.

"Hatch Overcure" is the depth beyond the layer thickness which is exposed during a given pass (hatch) of the laser.

"Hatch Spacing" is the distance between adjacent hatch vectors.

"Fill Cure Depth" is the absolute depth of curing for the fill vectors on a given pass of fill. Fills are tightly spaced vectors drawn on the regions of the part that form upfacing or downfacing surfaces.

"Fill Spacing" is the distance between adjacent fill vectors.

"Border Overcure" is the depth beyond the layer thickness that the borders are cured.

"Preferred Blade Gap" is a distance, given in percent of layer thickness, describing the preferred distance between the bottom of the recoater and last layer of the part at time of sweeping.

TABLE II

| Parameter | Value |
|---|---|
| Layer thickness | 0.004 inch |
| Hatch Overcure | 0.000 inch |
| Hatch Spacing | 0.004 inch |
| Fill Cure Depth | 0.010 inch |
| Fill Spacing | 0.004 inch |
| Border Overcure | 0.009 inch |
| Preferred Blade Gap | 0.004 inch |
| $D_p$ | 0.0063 inch |
| $E_c$ | 9.2 mJ/cm$^2$ |

TABLE III

| Parameter | Value |
|---|---|
| Layer thickness | 0.006 inch |
| Hatch Overcure | 0.002 inch |
| Hatch Spacing | 0.009 inch |
| Fill Cure Depth | 0.015 inch |
| Fill Spacing | |
| Border Overcure | 0.012 inch |
| Preferred Blade Gap | 0.004 inch |

TABLE III-continued

| Parameter | Value |
| --- | --- |
| Dp (Depth of Penetration) | 0.0057 inch |
| Ec (Critical Energy) | 6.3 mJ/cm$^2$ |

Example 1

The following components were mixed at room temperature in a container to form a homogeneous photocurable composition. The composition was an opaque liquid with a viscosity of 195 CPS at 30° C. (Brookfield, RVT).

Examples 2-5

The resin formulations shown in Table IV were prepared using the procedure described for Example 1 (The numbers in Table IV refer to the percent by weight for each component of the total mixture). Table V provides definitions for the trade names in Table IV.

TABLE IV

| Component | Ex. 1 | Ex. 2 | Ex. 3 | Ex. 4 | Ex. 5 |
| --- | --- | --- | --- | --- | --- |
| Uvacure 1500 | 49 | 45.18 | 39.42 | 33.95 | |
| Heloxy 48 | 8 | 27 | 28.84 | 15.52 | |
| Heloxy 84 | | | | 7.76 | 10 |
| Heloxy 107 | 8 | | | 12.80 | 15.1 |
| Gelest DBE-C25 | | | 3.85 | | |
| Albidur EP 2240 | 3 | | | | |
| Albidur VE 3320 | | | | 3 | |
| Albidur EP 5340 | | 10 | 1.92 | | 40 |
| Dianol 320 | | | | 7.76 | 15 |
| Polymeg 1000 | 6 | | | | |
| Polymeg 2000 | | | 7.69 | | |
| CHDM | 6 | | | | |
| SR 368 | 10 | | | | |
| SR 399 | 3 | 5.4 | 5.77 | 5.82 | |
| SR 9041 | | | | | 6.1 |
| Ebecryl 3700 | | 5.67 | 5.77 | 6.11 | |
| CN 120 | | | | | 6.3 |
| Vectomer 4010 | | | 1.92 | | |
| Irgacure 184 | 2 | 2.25 | 1.92 | 1.94 | 2.5 |
| UVI 6976 | 5 | 4.5 | 2.88 | 5.33 | 5 |
| BDMA | 0.01 | 0.01 | 0.01 | 0.010 | 0.01 |
| Total | 100.01 | 100.01 | 99.99 | 100.00 | 100.01 |

TABLE V

Definitions for Trade Names

| Trade Name | Source | Chemical Name |
| --- | --- | --- |
| UVACURE 1500 | UCB Chemicals Corp. (Radcure) | 3,4-Epoxycyclohexylmethyl 3',4'-epoxycyclohexanecarboxylate |
| HELOXY 48 | Resolution Performance Products LLC | Trimethylolpropane triglycidyl ether |
| HELOXY 84 | Resolution Performance Products LLC | Triglycidyl ether of polypropoxylated glycerol |
| HELOXY 107 | Resolution Performance Products LLC | Diglycidyl ether of CHDM |
| Gelest DBE-C25 | Genesee Polymers Corporation | Poly(dimethylsiloxane), hydroxy(polyethyleneoxy)-propylether terminated |
| Albidur EP 2240 | Hanse Chemie | Silicone-epoxy particles in Bisphenol A epoxy resin |
| Albidur VE 3320 | Hanse Chemie | Silicone-vinyl ester particles in vinyl ester resin and styrene |
| Albidur EP 5340 | Hanse Chemie | Silicone-epoxy particles in alicyclic epoxy resin |
| Polymeg 1000 | Penn Specialty Chemicals | Polytetramethylene ether glycol (MW ca. 1000) |
| Polymeg 2000 | Penn Specialty Chemicals | Polytetramethylene ether glycol (MW ca. 2000) |
| CHDM 99% | Aldrich Chemical Co. | 1,4-Cyclohexanedimethanol |
| Dianol 320 | Seppic, Inc. | Dipropoxylated bisphenol A |
| SR 368 | Sartomer Co. | Tris(2-hydroxy ethyl) isocyanurate triacrylate |
| SR 399 | Sartomer Co. | Dipentaerythritol pentaacrylate |
| SR 9041 | Sartomer Co. | Pentaacrylate ester |
| CN 120 | Sartomer Co. | Bisphenol A Epoxy Diacrylate |
| Ebecryl 3700 | Radcure Specialties | Bisphenol A diglycidyl ether diacrylate [4687-94-9] |
| Vectomer 4010 | Morflex, Inc. | Bis[4-(vinyloxy)butyl] isophthalate, 98% |
| Irgacure 184 | Ciba Specialty Chemicals | 1-hydroxycyclohexyl phenyl ketone |
| Cyracure UVI 6976 | Dow Chemical Company | Mixture of PhS—(C$_6$H$_4$)—S$^+$Ph$_2$ SbF$_6^-$ and Ph$_2$S$^+$—(C$_6$H$_4$)S(C$_6$H$_4$)—S$^+$Ph$_2$ (SbF$_6^-$)$_2$ |

Example 9

A 3D Systems Viper Si2 (SLA 2500) machine was used to prepare 10 objects using the formulation of Example 1. The machine settings used are those in Table II. The objects were opaque white or off-white and had a glossy surface.

Example 10

An SLA 5000 machine was used to prepare 24 objects using the formulation of Example 1. The machine settings used are those in Table III. The objects were opaque white or off-white and had a glossy surface.

While embodiments of the invention have been described above, those embodiments illustrate but do not limit the invention. Adaptations and variations of those embodiments are within the scope of the invention as set forth in the following claims.

We claim:

1. A method for producing a solidified 3-D object comprising:
   (1) forming a first layer comprising a photocurable composition containing at least one photocurable monomer, at least one photoinitiator, at least one glycol or diol, and reactive particles comprising a crosslinked elastomeric core and a shell of reactive groups on an outer surface of the crosslinked elastomeric core wherein the crosslinked elastomeric core comprises a crosslinked polysiloxane material and wherein the reactive groups are epoxy groups, ethylenically unsaturated groups or hydroxy groups;
   (2) exposing the first layer to actinic radiation to form a hardened first layer;
   (3) forming a second layer comprising the photocurable composition on top of the hardened first layer;
   (4) exposing the second layer to actinic radiation to form a hardened second layer; and (5) repeating steps (3)-(4) as needed to produce the solidified 3-D object.

2. The method of claim 1 further comprising the step of postcuring the solidified 3-D object.

3. The method of claim 1 wherein the first and second layers are formed by jet deposition or by a surface layer of a bath of the photocurable composition.

4. The method of claim 1 wherein the solidified 3-D object is selected from the group consisting of an adhesive, a photoimageable coating, a coating for optical fibers, a 3-D object formed by printing or jetting, paint, a powder coating, a solder mask and a photoresist mask.

* * * * *